(12) United States Patent
Oh

(10) Patent No.: US 6,753,564 B2
(45) Date of Patent: Jun. 22, 2004

(54) CAPACITOR OF SEMICONDUCTOR DEVICE AND METHOD OF FABRICATING THE SAME

(75) Inventor: Ki-Young Oh, Cheongju (KR)

(73) Assignee: Hyundai MicroElectronics Co., Ltd., Chungcheongbuk-do (KR)

( * ) Notice: Subject to any disclaimer, the term of this patent is extended or adjusted under 35 U.S.C. 154(b) by 283 days.

(21) Appl. No.: 10/078,706

(22) Filed: Feb. 21, 2002

(65) Prior Publication Data

US 2002/0081813 A1 Jun. 27, 2002

Related U.S. Application Data

(62) Division of application No. 09/383,232, filed on Aug. 26, 1999, now Pat. No. 6,358,794.

(30) Foreign Application Priority Data

Sep. 10, 1998 (KR) .............................................. 98-37293

(51) Int. Cl.⁷ ............................................. H01L 27/108
(52) U.S. Cl. ........................ 257/296; 257/308; 257/303; 257/305
(58) Field of Search ................................ 257/303, 306, 257/308, 309, 296, 751; 438/396, 244, 253, 387, 399, 255, 338, 665, 764, 251, 394; 361/321.4, 306.1, 305, 303

(56) References Cited

U.S. PATENT DOCUMENTS

| 5,206,787 A | | 4/1993 | Fujioka |
| 5,798,903 A | * | 8/1998 | dhote et al. ............... 361/321.4 |
| 5,955,758 A | * | 9/1999 | sandhu et al. .............. 257/306 |
| 6,320,213 B1 | * | 11/2001 | kirlin et al. ................. 257/295 |

OTHER PUBLICATIONS

Ghandhi, Sorab K., *VLSI Fabrication Principles*, 1994, p. 545.*

* cited by examiner

Primary Examiner—Long Pham
Assistant Examiner—(Vikki) Hoa B. Trinh
(74) Attorney, Agent, or Firm—Birch, Stewart, Kolasch & Birch, LLP

(57) ABSTRACT

A capacitor of a semiconductor device is provided which includes a semiconductor substrate and insulating interlayer formed on the semiconductor substrate. The insulating interlayer has a contact hole which exposes a portion of the semiconductor substrate. A plug fills in the contact hole and the plug comes into contact with the semiconductor substrate. A contact layer is formed on the insulating interlayer. The contact layer comes into contact with the plug. First and second barrier layers are formed on the surface and sides of the contact layer, and a lower electrode is formed on the first barrier layer. A dielectric layer formed on the second barrier layer and lower electrode, and an upper electrode is formed on the dielectric layer.

9 Claims, 6 Drawing Sheets

CAPACITOR OF SEMICONDUCTOR DEVICE AND METHOD OF FABRICATING THE SAME

This application is a divisional of application Ser. No. 09/383,232, filed on Aug. 26, 1999, now U.S. Pat. No. 6,358,794, the entire contents of which are hereby incorporated by reference and for which priority is claimed under 35 U.S.C. §120; and this application claims priority of Application No. 98-37293 filed in Korea on Sep. 10, 1998 under 35 U.S.C. §119.

BACKGROUND OF THE INVENTION

1. Field of the Invention

The present invention relates to a capacitor in a semiconductor device and method of fabricating the same which prevents the resistance between its lower electrode and plug from increasing.

2. Discussion of Related Art

A variety of research has been performed for increasing the capacitance density of a semiconductor device to allow the capacitor to have a specific amount of capacitance even if the cell area becomes smaller as the device is more highly integrated. To obtain a large amount of capacitance, the capacitor's lower electrode is formed in three-dimensional structure, for example, stacked or trench structure, enlarging the surface area of the dielectric of the capacitor. However, the stacked or trench structured capacitor is fabricated through a complicated process. Accordingly, there are limitations on increasing the surface area of the dielectric. To solve this problem, there has been developed a method of enlarging the capacitance in which the dielectric is made of a material of a high dielectric constant, such as $Ta_2O_5$, $PZT(Pb(Zr\ Ti)O_3)$, $PLZT((Pb\ La)(Zr\ Ti)O_3)$, $PNZT(Pb(Nb\ Zr\ Ti)O_3)$, $PMN(Pb(Mg\ Nb)O_3)$, $BST((Ba\ Sr)TiO_3)$.

FIG. 1 is a cross-sectional view of a capacitor according to a related art. Referring to FIG. 1, N-type impurity region 13 is formed in semiconductor substrate 11, which serves as source and drain regions of a transistor including a gate (not shown in the drawing). Insulating interlayer 15 is formed on semiconductor substrate 11 to cover the transistor. Contact hole 17 exposing impurity region 13 is patterned in insulating interlayer 15. Impurity doped polysilicon is filled in contact hole 17 to form a plug 19 which is electrically connected to impurity region 13. Specifically, plug 19 is formed in such a manner that the doped polysilicon is deposited through CVD (chemical vapor deposition) and then etched back using RIE (reactive ion etching), to expose interlevel insulating layer 15.

Barrier layer 21 and lower electrode 23 are sequentially deposited on insulating interlayer 15 including plug 19. Barrier layer 21 which comes into contact with plug 19 is formed of TiN or TaN. Lower electrode 23 is formed in a manner that an oxidation-resist metal like Pt, Mo or Au, or metal whose oxide has conductivity such as Ir or Ru is deposited on barrier layer 21. Barrier layer 21 prevents the metal forming lower electrode 23 from reacting with silicon composing plug 19 and forming silicide. This is because the silicide is easily oxidized to be changed into an insulating material.

Dielectric layer 25 is formed on insulating interlayer 15 to cover lower electrode 23. Dielectric layer 25 is formed of a material having a high dielectric constant, for example, $Ta_2O_5$, $PZT(Pb(Zr\ Ti)O_3)$, $PLZT((Pb\ La)(Zr\ Ti)O_3)$, $PNZT(Pb(Nb\ Zr\ Ti)O_3)$, $PMN(Pb(Mg\ Nb)O_3)$, or $BST((Ba\ Sr)TiO_3)$. Upper electrode 27 is formed of the same metal as lower electrode 23 on dielectric layer 25. When lower and upper electrodes 23 and 27 are formed of an oxidation-resist metal, they are prevented from being oxidized even if they come into contact with dielectric layer 25. When the electrodes are formed of the metal whose oxide has conductivity, their resistances do not increase because they have conductivity even when they are oxidized.

FIGS. 2A to 2D are cross-sectional views showing a method of fabricating the conventional capacitor. Referring to FIG. 2A, insulating interlayer 15 is formed on P-typed semiconductor substrate 11 including N-type impurity region 13 serving as source and drain regions of a transistor having a gate (not shown). The insulating interlayer 15 P-typed semiconductor substrate 11 copy is then patterned through photolithography, forming contact hole 17 exposing impurity region 13. Referring to FIG. 2B, impurity doped polysilicon is deposited by CVD on insulating interlayer 15, to fill up contact hole 17. In this case, the polysilicon comes into contact with the exposed impurity region 13 through contact hole 17. Thereafter, the polysilicon is etched back using RIE to expose insulating interlayer 15. By doing so, the polysilicon is left only in contact hole 17, forming plug 19.

Referring to FIG. 2C, TiN or TaN is deposited on insulating interlayer 15 to come into contact with plug 19, and form barrier layer 21. Oxidation-resistant metal like Pt, Mo or Au, or metal whose oxide has electric conductivity such as Ir or Ru is deposited on barrier layer 21, to form lower electrode 23. Here, barrier layer 21 prevents lower electrode 21 from being reacted with plug 19, thereby eliminating the formation of the suicide between barrier layer 21 and plug 19. Lower electrode 23 and barrier layer 21 are patterned through photolithography, to be left on a predetermined area of insulating interlayer 15 including contact hole 17. In this case, lower electrode 23 and barrier layer 21 are patterned to have barrier layer 21 come into contact with plug 19.

Referring to FIG. 2D, a material having a high dielectric constant, for example, $Ta_2O_5$, $PZT(Pb(Zr\ Ti)O_3)$, $PLZT((Pb\ La)(Zr\ Ti)O_3)$, $PNZT(Pb(Nb\ Zr\ Ti)O_3)$, $PMN(Pb(Mg\ Nb)O_3)$, or $BST((Ba\ Sr)TiO_3)$ is deposited on insulating interlayer 15 to cover lower electrode 23, thereby forming dielectric layer 25. Here, when lower electrode 23 is formed with oxidation-resistant metal, it is prevented from being oxidized even if it comes into contact with dielectric layer 25 having an oxygen component. When lower electrode 23 is formed with a material whose oxide has electric conductivity, such as Ir or Ru, its resistance does not increase because it has electric conductivity even when oxidized.

Oxidation-resistant metal like Pt, Mo or Au, or metal whose oxide has conductivity, for example, Ir or Ru, is deposited on dielectric layer 25, to form upper electrode 27. That is, upper electrode 27 is formed of the same material as lower electrode 23. When upper electrode 27 is formed with an oxidation-resistant metal, it is prevented from being oxidized even if it comes into contact with dielectric layer 25. When upper electrode 27 is formed with a material whose oxide has electric conductivity, its resistance does not increase because it has conductivity even when oxidized. Upper electrode 27 and dielectric layer 25 are patterned, being left only on a portion corresponding to lower electrode 23. Only the portion of dielectric layer 25, which is placed between lower and upper electrodes 23 and 27, is used as dielectric storing charges.

As described above, the capacitance of the capacitor according to the related art increases because the dielectric layer is made of a material having a high dielectric constant. However, oxygen for forming the material with a high dielectric constant is diffused through the sides of the barrier when the dielectric layer is formed, to oxidize the barrier layer. This increases the contact resistance between the plug and lower electrode.

SUMMARY OF THE INVENTION

Accordingly, the present invention is directed to a capacitor of a semiconductor device and method of fabricating the same that substantially obviates one or more of the problems due to limitations and disadvantages of the related art.

An object of the present invention is to provide a capacitor which prevents the contact resistance between the plug and lower electrode from increasing due to oxidation of the barrier layer.

Another object of the present invention is to provide a method of fabricating a capacitor, which prevents the barrier layer from being oxidized, to keep the contact resistance between the plug and lower electrode from increasing.

To accomplish the objects of the present invention, there is provided a capacitor of a semiconductor device, which includes a semiconductor substrate, an insulating interlayer formed on the semiconductor substrate, the insulating interlayer having a contact hole which exposes a predetermined portion of the semiconductor substrate, a plug filled in the contact hole, the plug coming into contact with the semiconductor substrate, a contact layer formed on the insulating interlayer, the contact layer coming into contact with the plug, first and second barrier layers formed on the surface and sides of the contact layer, a lower electrode formed on the first barrier layer, a dielectric layer formed on the second barrier layer and lower electrode, and a upper electrode formed on the dielectric layer.

To accomplish the objects of the present invention, there is also provided a method of fabricating a capacitor of a semiconductor device, including the steps of forming an insulating interlayer on a semiconductor substrate and pattering it, to form a contact hole which exposes a predetermined portion of the semiconductor substrate, forming a plug in the contact hole, the plug coming into contact with the semiconductor substrate, sequentially forming a contact layer, first barrier layer and lower electrode on the insulating interlayer and pattering them to be left on the plug, the contact layer coming into contact with the plug, forming a second barrier layer on the sides of the patterned contact layer, and forming a dielectric layer and upper electrode on the lower electrode and second barrier layer.

It is to be understood that both the foregoing general description and the following detailed description are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this specification, illustrate embodiments of the invention and together with the description serve to explain the principles of the invention.

In the drawings.

DETAILED DESCRIPTION OF THE PREFERRED EMBODIMENTS

Reference will now be made in detail to the preferred embodiments of the present invention, examples of which are illustrated in the accompanying drawings.

Figure 1:
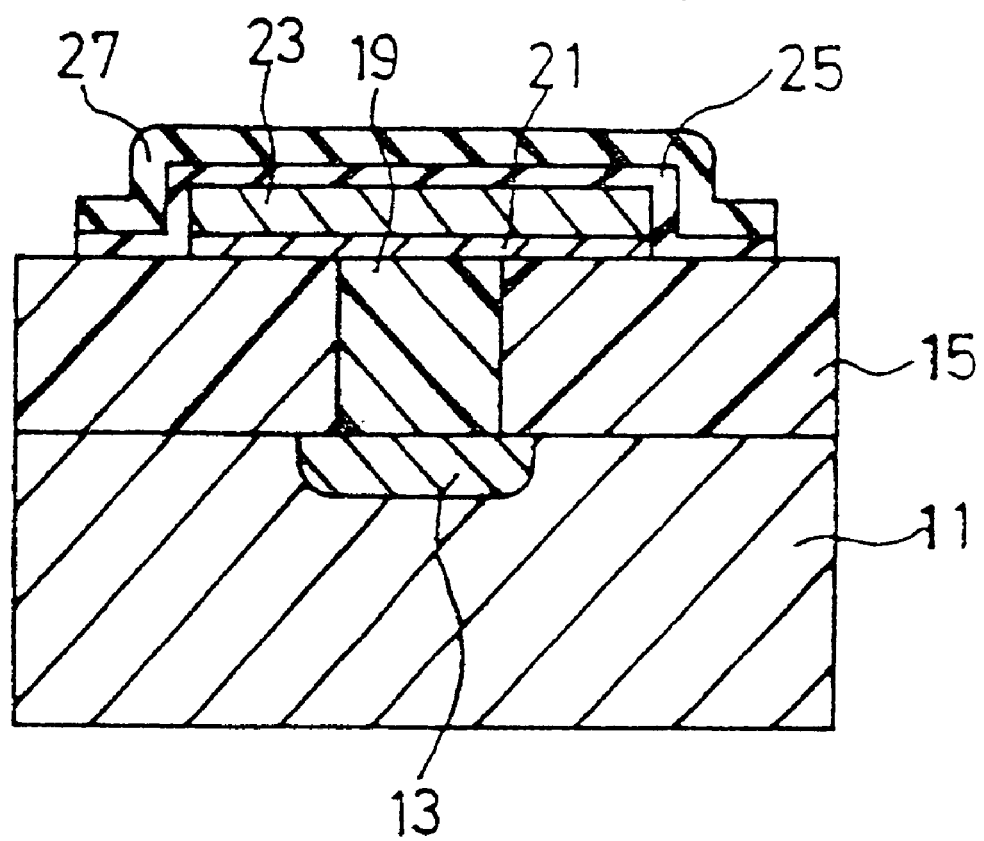
FIG. 1 is a cross-sectional view of a capacitor according to a related art.
Figure 2A:
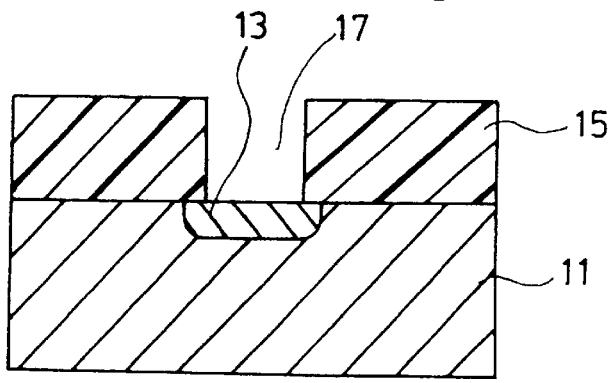
FIGS. 2A to 2D are cross-sectional views showing a process of fabricating the capacitor according to the related art.
Figure 2B:
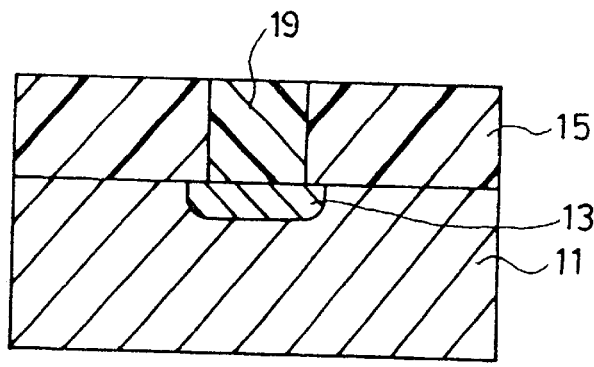
Figure 2C:
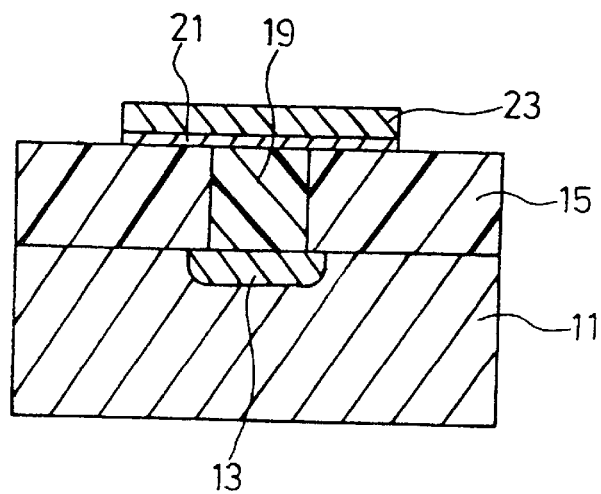
Figure 2D:
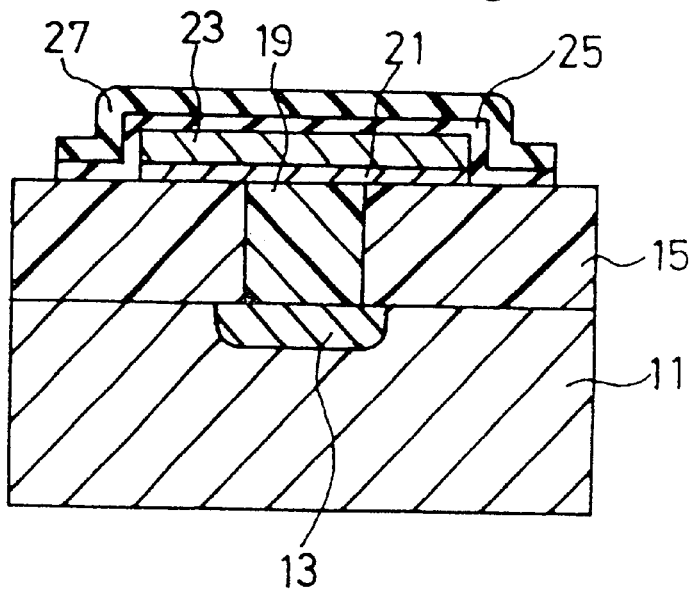
Figure 3:
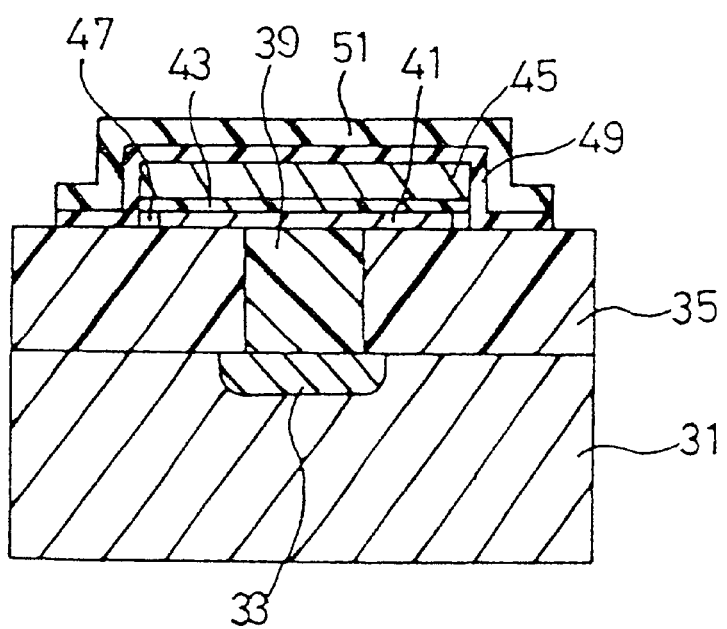
FIG. 3 is a cross-sectional view of a capacitor according to the present invention.

FIG. 3 is a cross-sectional view of a capacitor according to the present invention. Referring to FIG. 3, N-type impurity region 33 is formed in P-type semiconductor substrate 31, which serves as source and drain regions of a transistor including a gate (not shown in the drawing). An insulating material such a silicon oxide is deposited on semiconductor substrate 31 through CVD, to form insulating interlayer 35 covering the transistor. Insulating interlayer 35 is patterned to form contact hole 37 exposing impurity region 33. Plug 39 is formed in contact hole 37, which is electrically connected to impurity region 33. Specifically, plug 39 is formed in such a manner that impurity doped polysilicon is deposited on insulating interlayer 35 using CVD to fill up contact hole 37, and then etched back using RIE.

Contact layer 41, first barrier layer 43 and lower electrode layer 45 are sequentially formed on insulating interlayer 35 including contact hole 37, and then they are patterned. A second barrier layer 47 is formed on the sides of contact layer 41. Contact layer 41 is formed of silicide such as $TiSi_2$, $TaSi_2$, $MoSi_2$, $WSi_2$ or $CoSi_2$ to a thickness of 100 to 500 Å. Specifically, contact layer 41 is formed in such a manner that polysilicon is deposited on insulating interlayer 35 using CVD to come into contact with plug 39 and, successively, a refractory metal like Ti, Ta, Mo, W or Co is deposited on the polysilicon layer and heat treatment is performed. Otherwise, silicide such as $TiSi_2$, $TaSi_2$, $MoSi_2$, $WSi_2$ or $CoSi_2$ is deposited by sputtering to form contact layer 41.

First barrier layer 43 is formed with TiSiN, TaSiN, MoSiN, WSiN or CoSiN to a thickness of 50 to 200 Å on contact layer 41. Specifically, first barrier layer 43 is formed in a manner that the surface of contact layer 41 is nitrided, or one of TiSiN, TaSiN, MoSiN, WSiN and CoSiN is deposited on contact layer 41 by sputtering. First barrier 43 prevents lower electrode 45 from being reacted with the silicon forming plug 39 and changed into silicide. This is needed because the silicide is easily oxidized to become insulating material.

Lower electrode 45 is formed in a manner that oxidation-resistant metal such as Pt, Mo or Au, or metal whose oxide has electric conductivity such as Ir or Ru is deposited on first barrier layer 43. Second barrier layer 47 is formed in a manner that TiSiN, TaSiN, MoSiN, WSiN or CoSiN is deposited on the exposed sides of patterned contact layer 41 to a thickness of 50 to 100 Å. Second barrier layer 47 is formed on the exposed sides of contact layer 41 in an ambient atmosphere of nitrogen using the RTA or plasma method. Accordingly, contact layer 41 is covered by first and second barrier layers 43 and 47. Dielectric layer 49 is formed on insulating interlayer 35 to cover lower electrode 45 and second barrier layer 47. Dielectric layer 49 is made of a material having a high dielectric constant, for example $Ta_2O_5$, PZT($Pb(Zr\ Ti)O_3$), PLZT(($Pb\ La)(Zr\ Ti)O_3$), PNZT ($Pb(Nb\ Zr\ Ti)O_3$), PMN($Pb(Ng\ Nb)O_3$), or BST(($Ba\ Sr)TiO_3$).

When lower electrode 45 is formed with oxidation-resistant metal like Pt, Mo or Au, it is prevented from being oxidized even if it comes into contact with dielectric layer having oxygen component. When it is formed of the material whose oxide has electric conductivity, such as Ir or Ru, its resistance does not increase because it has electric conductivity even when oxidized. Dielectric layer 49 does not come into contact with contact layer 41 due to second barrier layer 47 placed therebetween. Accordingly, contact layer 41 is prevented from being oxidized by oxygen contained in dielectric layer 49. Upper electrode 51 is formed of the same material as lower electrode 45 on dielectric layer 49. When upper electrode 51 is formed with oxidation-resistant metal, it is prevented from being oxidized even if it comes into contact with dielectric layer 49. When it is formed of the material whose oxide has electric conductivity, its resistance does not increase because it has conductivity even when oxidized.

Figure 4A:
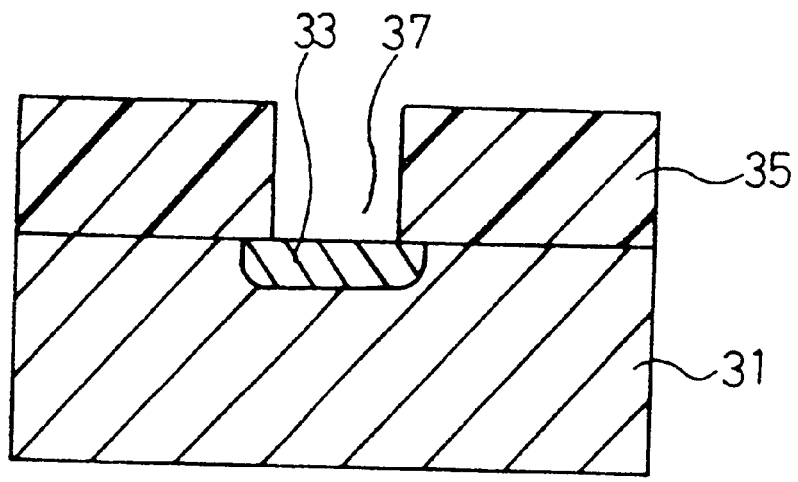
FIGS. 4A to 4E are cross-sectional views showing a process of fabricating the capacitor according to the present invention.
Figure 4B:
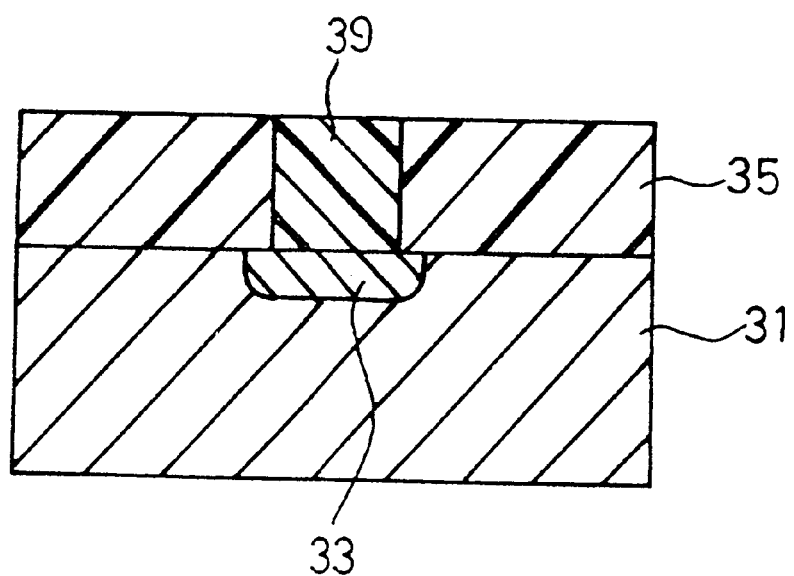

FIGS. 4A to 4E are cross-sectional views showing a process of fabricating the capacitor according to the present invention. Referring FIG. 4A, an insulating material like silicon oxide is deposited using CVD on P-typed semiconductor substrate 31 including N-typed impurity region 33. The P-typed semiconductor substrate copy serves as source and drain regions of a transistor having a gate (not shown in the drawing). The insulating material covers the transistor, thereby forming insulating interlayer 35. Insulating interlayer 35 is patterned through photolithography, forming contact hole 37 exposing impurity region 33. Referring to FIG. 4B, impurity doped polysilicon is deposited by CVD on insulating interlayer 35, to fill up contact hole 37. The polysilicon layer is etched back using RIE to expose insulating interlayer 35, thereby forming plug 39 which fills up contact hole 37 and electrically connects to impurity region 33.

Figure 4C:
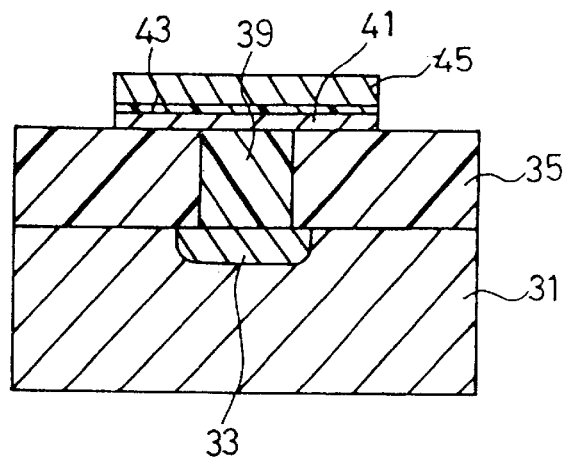

Referring to FIG. 4C, contact layer 41 is formed on insulating interlayer 35, to come into contact with plug 39. Specifically, contact layer 41 is formed of silicide such as $TiSi_2$, $TaSi_2$, $MoSi_2$, $WSi_2$ or $CoSi_2$ in thickness of 100 to 500 Å. Contact layer 41 may be formed in such a manner that polysilicon is deposited on insulating interlayer 35 using CVD and, successively, a refractory metal like Ti, Ta, Mo, W or Co is deposited on the polysilicon layer and heat treatment is performed. Otherwise, silicide such as $TiSi_2$, $TaSi_2$, $MoSi_2$, $WSi_2$ or $CoSi_2$ is deposited by sputtering to form contact layer 41. First barrier layer 43 is formed of TiSiN, TaSiN, MoSiN or CoSiN to a thickness of 50 to 200 Å on contact layer 41. First barrier layer 43 is formed in such a manner that the surface of contact layer 41 is nitrided using the RTA method at a temperature of 700 to 1000° C. for 10–60 seconds or using the plasma method at a temperature of 300 to 500° C. for 1–5 minutes. Or, one of TiSiN, TaSiN, MoSiN, WSiN, or CoSiN is deposited on contact layer 41 using sputtering. Here, the substrate temperature is 400 to 500° C. when first barrier layer 43 is formed.

Oxidation resistant metal like Pt, Mo or Au, or metal whose oxide has conductivity like Ir or Ru is deposited on first barrier layer 43 to a thickness of 1550 to 4000 Å using sputtering, thereby forming lower electrode 45. First barrier layer 43 prevents lower electrode 45 from being reacted with plug 39. Thus, silicide is not formed between lower electrode 45 and plug 39. Lower electrode 45, first barrier layer 43 and contact layer 41 are patterned through photolithography, to be left on a predetermined portion of insulating interlayer 35 including contact hole 37. Here, first barrier layer 41 is patterned to come into contact with plug 39.

Figure 4D:
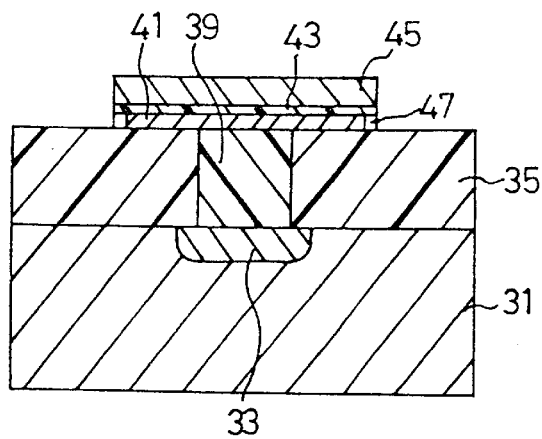

Referring to FIG. 4D, second barrier layer 47 is formed of TiSiN, TaSiN, MoSiN, WSiN or CoSiN to a thickness of 50 to 100 Å on the exposed sides of the patterning contact layer 41. Here, second barrier layer 47 is formed in a manner that the exposed sides of contact layer 41 are nitrided at a substrate temperature of 400 to 500° C. using the RTA method at a temperature of 700–1000° C. for 10–60 seconds or using the plasma method at a temperature of 300–500° C. for 1–5 minutes. Accordingly, contact layer 41 is covered by first and second barrier layers 43 and 47.

Figure 4E:
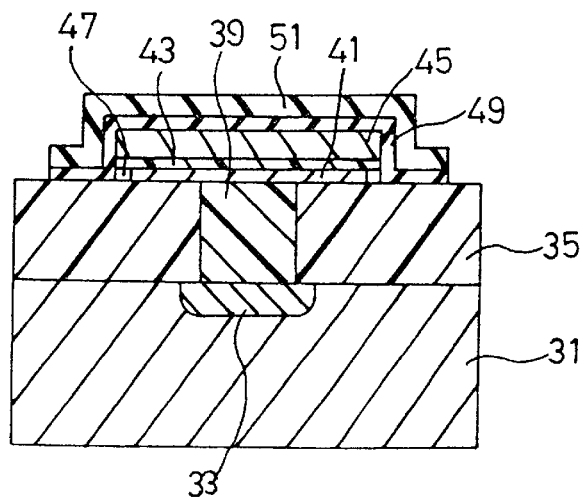

Referring to FIG. 4E, dielectric layer 49 is formed on insulating interlayer 35, to cover lower electrode 45 and second barrier layer 47. Specifically, dielectric layer 49 is made of a material having a high dielectric constant, for example, $Ta_2O_5$, PZT(Pb(Zr Ti)$O_3$), PLZT((Pb La)(Zr Ti)$O_3$), PNZT(Pb(Nb Zr Ti)$O_3$), PMN(Pb(Mg Nb)$O_3$), or BST((Ba Sr)Ti$O_3$) by 300 to 1000 Å. Dielectric layer 49 may be formed in a manner that a material with a high dielectric constant is deposited in an ambient atmosphere of oxygen at a high temperature of 300 to 600° C. by sputtering or MOCVD (Metal Organic CVD), or dielectic material is coated using the Sol-Gel method and annealed in the ambient atmosphere of oxygen at a high temperature of 400 to 600° C.

When lower electrode 45 is formed with oxidation-resistant metal, it is prevented from being oxidized even if it comes into contact with dielectric layer 49 having oxygen component. When it is formed of the material whose oxide has electric conductivity such as Ir or Ru, its resistance does not increase because it has electric conductivity even when oxidized. Second barrier layer 47 prevents contact layer 41 from being oxidized by oxygen composing dielectric layer 49, not allowing the contact resistance between plug 39 and lower electrode 45 to increase. Oxidation-resistant metal like Pt, Mo or Au, or metal whose oxide has electric conductivity like Ir or Ru is deposited to a thickness of 1000 to 2000 Å on dielectric layer 49 using sputtering, thereby forming upper electrode 51. Thereafter, upper electrode 51 and dielectric layer 49 are patterned to be left on a predetermined portion corresponding lower electrode 45.

Figure 5:
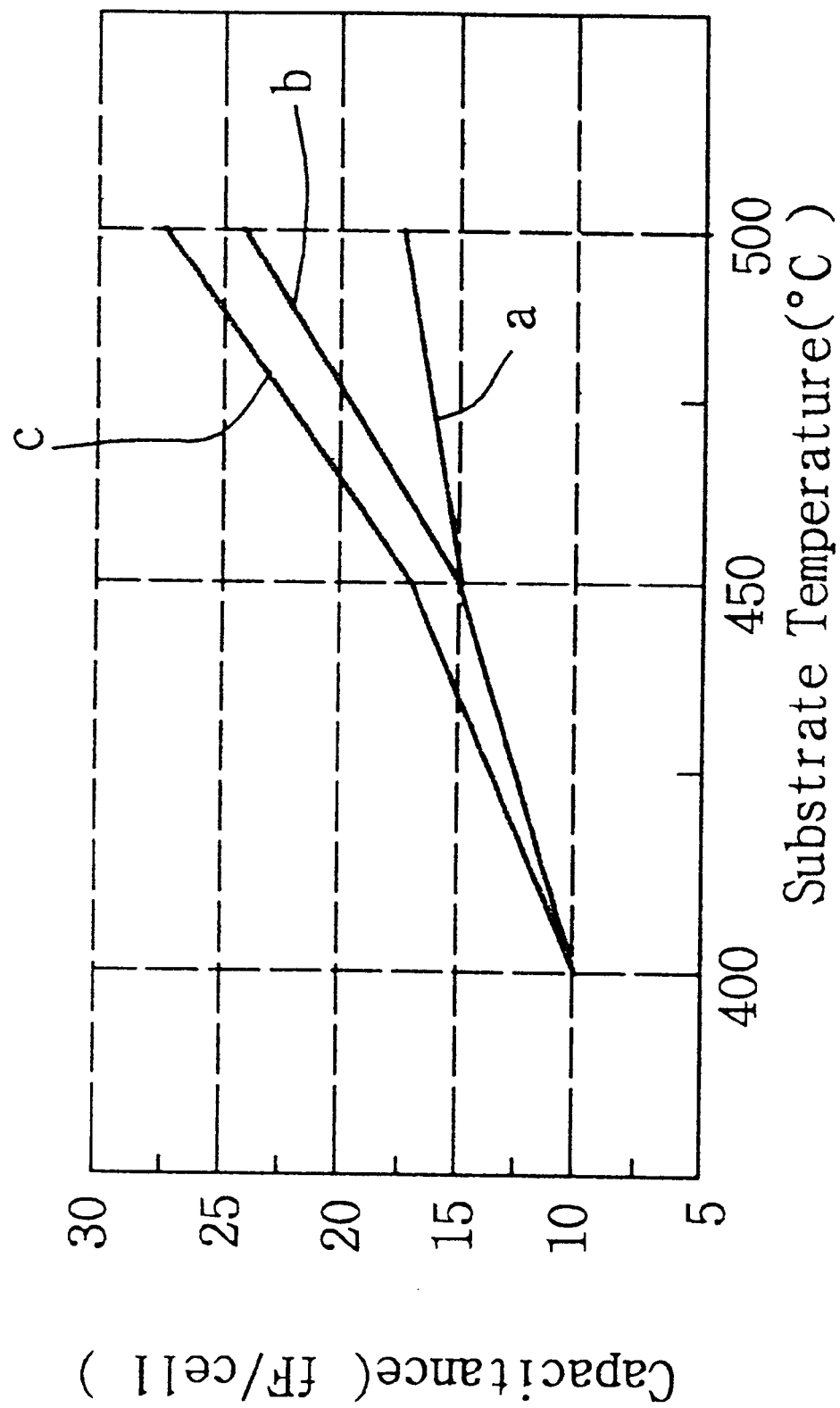
FIG. 5 is a graph showing the relationship between the capacitance of a capacitor and substrate temperature when the dielectric layer of the capacitor is formed.

FIG. 5 is a graph showing the relationship between the capacitance of a capacitor and substrate temperature when the dielectric layer of the capacitor is formed. The curve (a) shows the capacitance of the a capacitor according to a related art, and curves (b) and (c) show the capacitances of the capacitors each of which has second barrier layer 47 according to the present invention. With curves (b) and (c), contact layer 41 is formed by the salicide method and sputtering method, respectively. From the graph of FIG. 5, the capacitances of the capacitors according to the prior art and present invention increase as the substrate temperature rises when dielectric layer 49 is formed. The capacitors of the prior art and present invention have similar capacitances of about 10 fF/cell at the substrate temperature of 400° C.

However, the capacitances vary at a substrate temperature of 450 to 500° C. At 500° C., curve (a) illustrates capacitance of 17 fF/cell, and curves (b) and (c) illustrate 24 fF/cell and 27 fF/cell, respectively. That it, the capacitance of the capacitor according to the present invention is larger than that of the conventional capacitor. This means that second barrier 47 of the capacitor of the invention prevents contact layer 41 from being oxidized. Furthermore, contact layer 41 is formed thicker when it is deposited by sputtering rather than the salicide method. This allows the surface area of dielectric layer 49 to increase when contact layer 41 is formed using sputtering. Accordingly, the capacitance shown in curve (b) is larger than the one shown as curve (c).

As described above, the method of fabricating a capacitor according to the present invention patterns the contact layer, first barrier layer and lower electrode to come into contact with the plug, the exposed sides of the contact layer are nitrided to form the second barrier layer, and the dielectric layer and upper electrode are formed. Accordingly, the present invention prevents the contact layer from being oxidized using the second barrier when the dielectric layer is made of a material with a high dielectric constant containing oxygen. This prevents the resistance between the plug and lower electrode from increasing.

It will be apparent to those skilled in the art that various modifications and variations can be made in the capacitor of a semiconductor device and method of fabricating the same of the present invention without departing from the spirit or scope of the invention. Thus, it is intended that the present invention cover the modifications and variations of this invention provided they come within the scope of the appended claims and their equivalents.

What is claimed is:

1. A capacitor of a semiconductor device, the capacitor comprising:
   a semiconductor substrate;
   an insulating interlayer formed on the semiconductor substrate, the insulating interlayer having a contact hole which exposes a predetermined portion of the semiconductor substrate;
   a plug filled in the contact hole, the plug coming into contact with the semiconductor substrate;
   a contact layer formed on the insulating interlayer, the contact layer coming into contact with the plug;
   a first barrier layer, formed on an upper surface of the contact layer, and a second barrier layer formed beneath the first barrier layer on the side surfaces of the contact layer;
   a lower electrode formed on the first barrier layer;
   a dielectric layer formed on the second barrier layer and lower electrode; and
   an upper electrode formed on the dielectric layer.

2. The capacitor of a semiconductor device as claimed in claim 1, wherein the contact layer is formed of one of $TiSi_2$, $TaSi_2$, $MoSi_2$, $WSi_2$ and $CoSi_2$.

3. The capacitor of a semiconductor device as claimed in claim 2, wherein the contact layer is formed using salicide method or sputtering.

4. The capacitor of a semiconductor device as claimed in claim 1, wherein the first and second barrier layers are formed by nitriding the surface of the contact layer.

5. The capacitor of a semiconductor device as claimed in claim 4, wherein the first and second barrier layers are formed of one of TiSiN, TaSiN, MoSiN, WSiN or CoSiN.

6. The capacitor of a semiconductor device as claimed in claim 1, wherein the lower and upper electrodes are formed with oxidation-resistant metals including Pt, Mo or Au.

7. The capacitor of a semiconductor device as claimed in claim 1, wherein the lower and upper electrodes are formed with a metal whose oxide has conductivity, including Ir and Ru.

8. The capacitor of a semiconductor device as claimed in claim 1, wherein the lower and upper electrodes are formed by sputtering.

9. The capacitor of a semiconductor device as claimed in claim 1, wherein the dielectric layer is made of a material with a high dielectric constant, including $Ta_2O_5$, PZT(Pb(Zr Ti)$O_3$), PLZT((Pb La)(Zr Ti)$O_3$), PNZT(Pb(Nb Zr Ti)$O_3$), PMN(Pb(Mg Nb) $O_3$), and BST((Ba Sr) $TiO_3$).

* * * * *